United States Patent
Lee

(10) Patent No.: US 6,818,511 B2
(45) Date of Patent: Nov. 16, 2004

(54) NON-VOLATILE MEMORY DEVICE TO PROTECT FLOATING GATE FROM CHARGE LOSS AND METHOD FOR FABRICATING THE SAME

(75) Inventor: Wook-Hyoung Lee, Kyungki-do (KR)

(73) Assignee: Samsung Electronic Co., Ltd., Suwon (JP)

( * ) Notice: Subject to any disclaimer, the term of this patent is extended or adjusted under 35 U.S.C. 154(b) by 0 days.

(21) Appl. No.: 10/692,590

(22) Filed: Oct. 23, 2003

(65) Prior Publication Data
US 2004/0087086 A1 May 6, 2004

(30) Foreign Application Priority Data
Oct. 23, 2002 (KR) .................. 10-2002-0064768

(51) Int. Cl.[7] ............................................. H01L 21/336
(52) U.S. Cl. .................. 438/266; 438/201; 438/211; 438/257; 438/258; 438/296; 438/221; 438/223; 438/199; 438/473; 438/471
(58) Field of Search .................. 438/266, 201, 438/211, 257, 258, 296, 221, 223, 199, 473, 471

(56) References Cited

U.S. PATENT DOCUMENTS

| | | | |
|---|---|---|---|
| 6,287,916 B1 | | 9/2001 | Mehta |
| 6,512,263 B1 | * | 1/2003 | Yuan et al. .................. 257/316 |
| 2002/0045304 A1 | * | 4/2002 | Lee ............................. 438/201 |
| 2004/0087089 A1 | * | 5/2004 | Matsui et al. ............... 438/266 |

* cited by examiner

Primary Examiner—Matthew Smith
Assistant Examiner—Victor V Yevsikov
(74) Attorney, Agent, or Firm—Marger Johnson & McCollom, P.C.

(57) ABSTRACT

Disclosed are a non-volatile memory device to protect a floating gate from charge loss and a method for forming the same. At least a pair of floating gate lines are formed on a semiconductor substrate. A portion of the substrate between the floating gate lines is etched to form a trench therein. A gap-fill dielectric layer is formed in the trench and also in the gap between the pair of floating gate lines. The gap-fill dielectric layer is implanted with impurities so that positive mobile ions that may permeate the floating gate through the gap-fill dielectric layer can be trapped in the gap-fill dielectric layer.

19 Claims, 12 Drawing Sheets

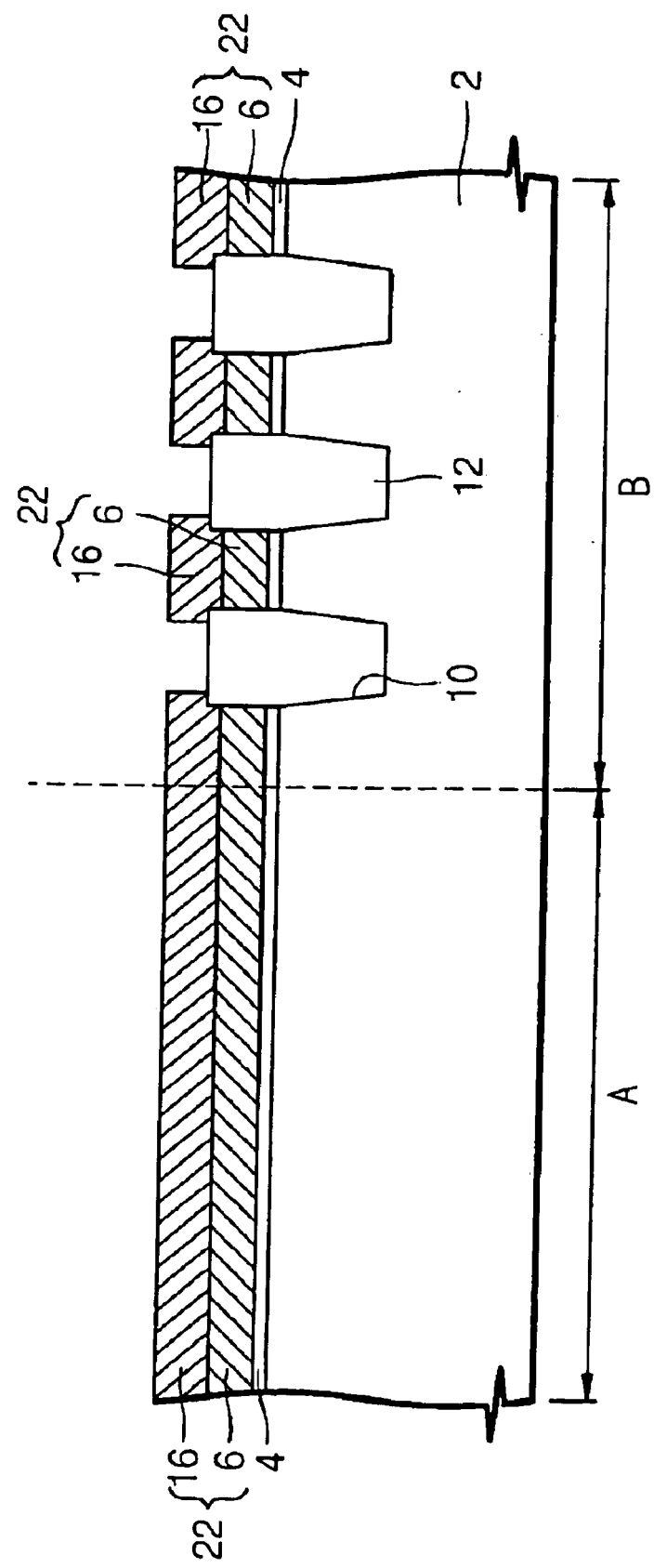

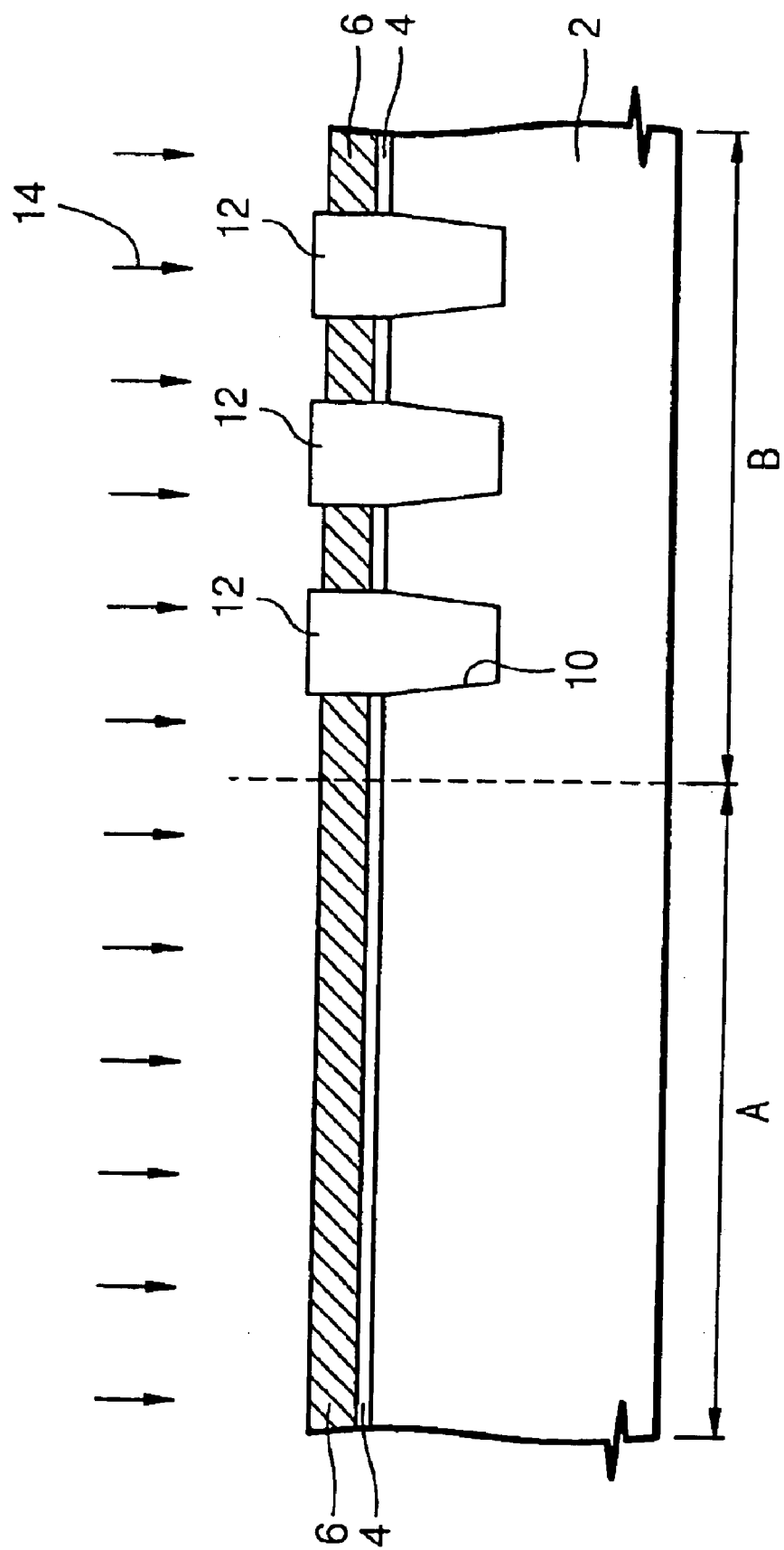

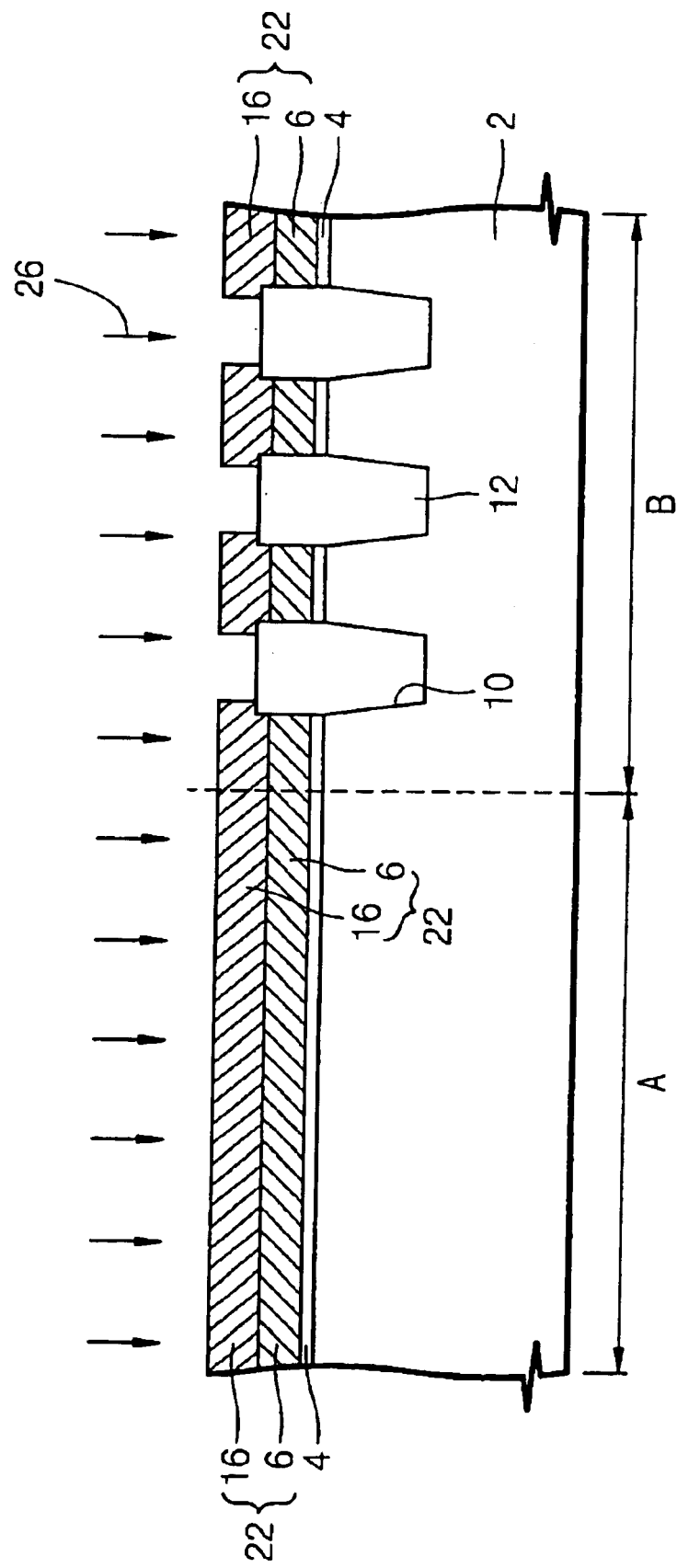

NON-VOLATILE MEMORY DEVICE TO PROTECT FLOATING GATE FROM CHARGE LOSS AND METHOD FOR FABRICATING THE SAME

This application claims priority from Korean Patent Application No. 2002-06478, filed on Oct. 23, 2002, the contents of which are incorporated herein by reference in their entirety.

BACKGROUND OF THE INVENTION

1. Field of the Invention

The present invention relates to the filed of a non-volatile memory device and, more particularly, to a non-volatile memory device to protect a floating gate from charge loss and a method for fabricating the same.

2. Description of the Related Art

In EEPROM (Electrically Erasable and Programmable Read Only Memory) devices, information can be stored by varying the amount of electrical charges within floating gate structures, i.e., altering the threshold voltages of transistors.

The reliability of EEPROM devices mainly depends on their endurance and charge retention characteristics. The endurance characteristic is the ability to maintain the threshold voltage independently of environmental conditions, and the charge retention characteristic is the capability to retain charges in the floating gate. The endurance characteristic may be weakened by the deterioration of the tunnel oxide layer, which is mainly caused by tunneling of charges. The charge retention characteristic may be weakened by charge loss caused by positive mobile ions and also by the defects of the dielectric layer that covers the floating gate. Namely, positive ions (e.g. hydrogen ions) in the dielectric layer covering the floating gate are introduced into the floating gate. The positive ions introduced into the floating gate are coupled to the electrons that are accumulated in the floating gate. Therefore, charge loss occurs and charge retention capability of the non-volatile memory device is deteriorated.

For this reason, positive mobile ion contamination during the fabrication of an EEPROM device must be reduced to a minimum to prevent degradation of charge retention characteristic. In particular, it is required that positive mobile ions ($H^+$, $K^+$, $Na^+$, etc) be prevented from being introduced into the floating gate through the dielectric layer adjacent the floating gate. In this sense, deterioration of charge retention characteristic caused by positive mobile ions near the floating gate is a major problem because the number of charges needed to alter threshold voltage decreases as the device size becomes smaller.

One approach to reduce charge loss of the non-volatile memory device is formation of a barrier layer to prevent hydrogen ions from diffusing into the floating gate is disclosed in U.S. Pat. No. 6,287,916 entitled "METHOD FOR FORMING A SEMICONDUCTOR DEVICE USING LPCVD NITRIDE TO PROTECT FLOATING GATE FROM CHARGE LOSS". This method comprises a step of depositing a barrier layer after a step of forming a gate. In this invention, hydrogen ions are prevented from being introduced into the floating gate.

On the other hand, as the integration degree of the non-volatile memory device increases, the STI (Shallow Trench Isolation) process is mainly used for device isolation instead of the LOCOS (Local Oxidation of Silicon) process. In the LOCOS process, a field region that defines an active region is formed by thermal oxidation. On the other hand, in the STI process, a field region is formed of Chemical Vapor Deposition (CVD) oxide filling the trench. With respect to the thermal oxide layer, this gap-fill oxide layer contains many positive porous ions. The positive ions contained in the gap-fill oxide layer may be positive ions caused by a CMP (Chemical Mechanical Polishing) or metal contact process. These positive ions can be introduced into the floating gate through the gap-fill oxide layer, thereby deteriorating device characteristics such as charge retention characteristics.

SUMMARY OF THE INVENTION

The present invention provides, among other things, a non-volatile memory device that can protect a floating gate from charge loss and a method for fabricating the same.

In the present invention, positive mobile ions can be prevented from penetrating the floating gate through the gap-fill oxide layer. To this end, a gap-fill dielectric layer is implanted with, for example, phosphorous ions to form a getter layer that can trap the positive mobile ions.

According to one embodiment, at least a pair of floating gate lines are formed on a semiconductor substrate. The pair of floating gate lines define a gap therebetween. Next, a portion of the substrate between the floating gate lines is etched to form a trench therein. A gap-fill dielectric layer is formed in the trench and also in the gap between the pair of floating gate lines. The gap-fill dielectric layer is implanted with impurities to form a getter layer that can trap positive mobile ions.

Consequently, the positive mobile ions that may permeate the floating gate through the gap-fill dielectric layer can be trapped in the gap-fill dielectric layer.

Next, a conductive layer is formed on the floating gate lines and on the gap-fill dielectric layer with an inter-gate dielectric disposed therebetween. The conductive layer and the floating gate lines are patterned to form a word line and a floating gate.

According to another embodiment of the present invention, a non-volatile memory device comprises a trench field region formed on a substrate. The trench field region defines an active region. A floating gate is positioned on a portion of the active region, and a word line extends over the floating gate and a portion of the trench field region. A getter layer is formed in the trench field region adjacent the floating gate. The getter layer is implanted with, for example, phosphorous ions.

BRIEF DESCRIPTION OF THE DRAWINGS

For a better understanding of the present invention, reference is made to the below-referenced accompanying Drawing.

FIGS. 2A–2J are cross-sectional views illustrating a NOR type non-volatile memory device according to an embodiment of the present invention.

FIG. 3 is a cross-sectional view illustrating a non-volatile memory device according to another embodiment of the present invention.

FIG. 5 is a cross-sectional view illustrating a non-volatile memory device according to still another embodiment of the present invention.

DETAILED DESCRIPTION OF THE INVENTION

Figure 1A:
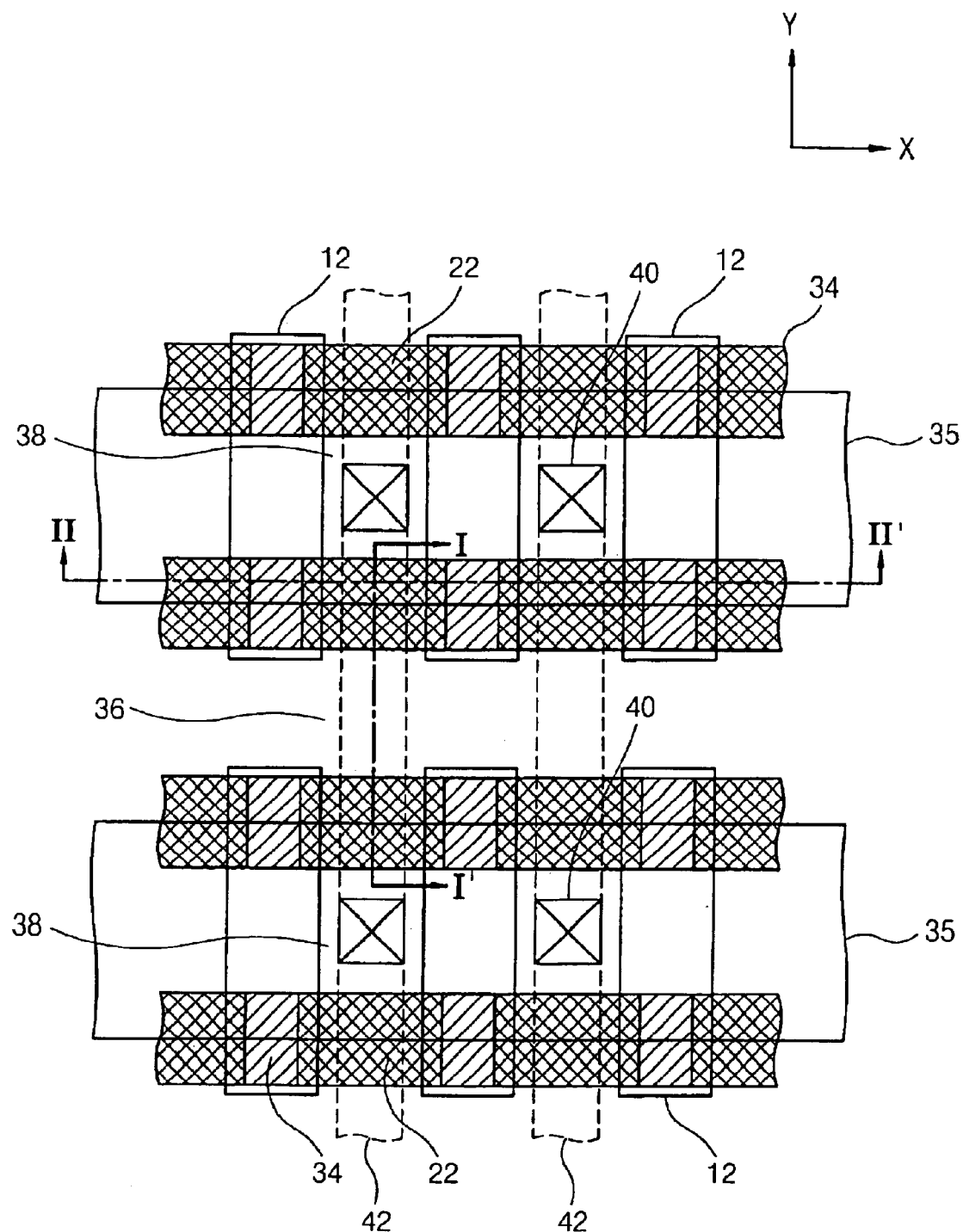
FIG. 1A is a plane view illustrating a NOR type cell.
Figure 1B:
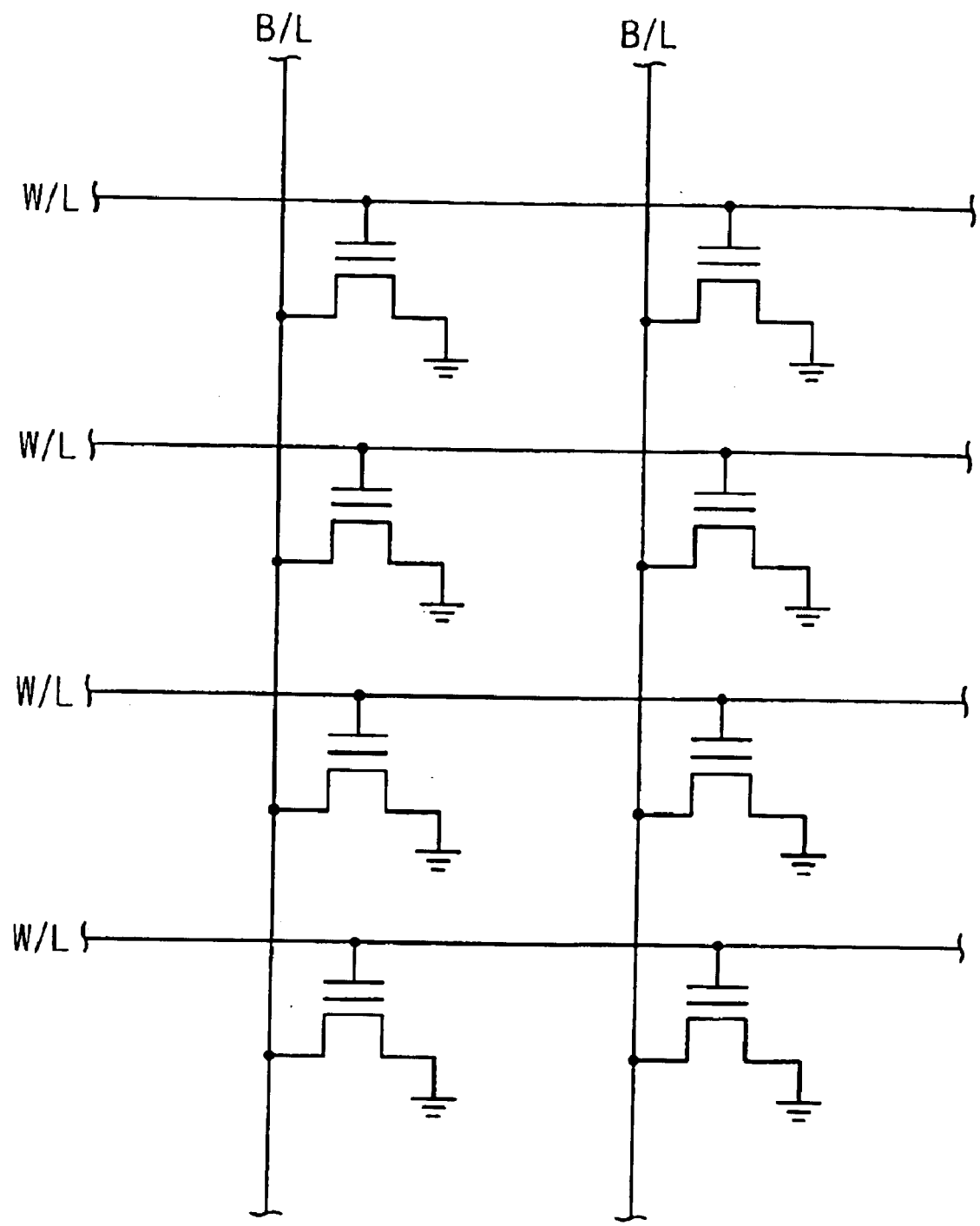
FIG. 1B is an equivalent circuit illustrating a NOR type cell.

Referring to FIG. 1A, a field region 12 is formed in a substrate 2 (not illustrated in FIG. 1A) to define an active region. A floating gate 22 is arranged on a portion of the active region. A tunnel dielectric layer 4 (not shown in FIG. 1A) is interposed between the active region and the floating gate 22. The floating gate 22 partially overlaps a portion of the field region 12. A word line 34 extends over the floating gate 22 and also over the field region 12. An inter-gate dielectric layer 28 (FIG. 2I) is interposed between the floating gate 22 and the control gate 30 (FIG. 2I).

A source region 36 is formed in the active region on one side of the word line 34 and a drain region 38 is formed in the active region on the other side of the word line 34 by performing ion implantation on the active regions. A contact 40 is formed on the drain region 38 to be connected to a bit line 42. The bit line 42 is formed perpendicular to the word line 34. Reference numeral 35 indicates a mask pattern to form a common source line.

A method for a NOR type non-volatile memory device according to an embodiment of the present invention is explained as follows.

FIGS. 2A–2J are cross-sectional views illustrating a NOR type non-volatile memory device according to an embodiment of the present invention. Reference symbol A indicates a Y-axis cross-sectional view taken along line I—I' of FIG. 1A. Also, reference symbol B indicates an X-axis cross-sectional view taken along line II—II' of FIG. 1A.

Figure 2A:
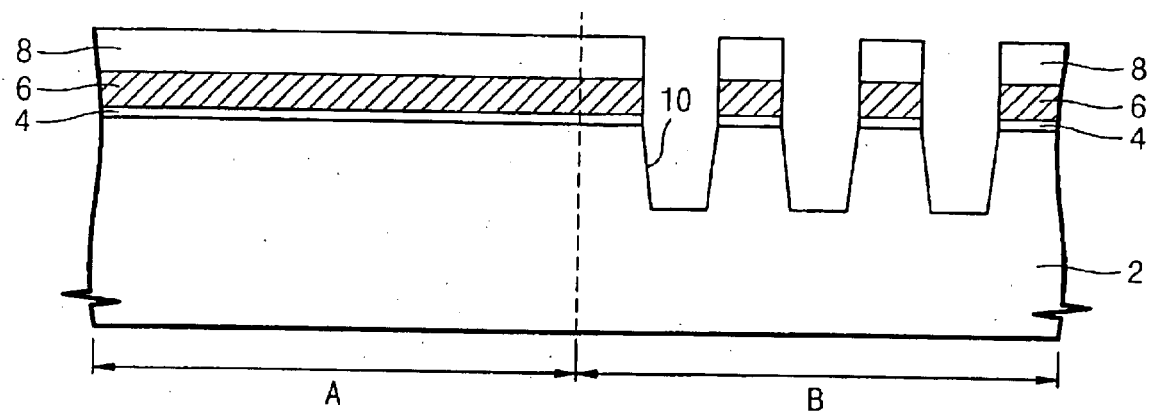

Referring to FIG. 2A, a tunnel dielectric layer 4, a lower floating gate conductive layer, and a polishing stop layer 8 are successively formed on a semiconductor substrate 2. The tunnel dielectric layer 4 may be formed of silicon oxide. The lower floating gate conductive layer may be formed of polysilicon. The polishing stop layer 8 may be formed of silicon nitride (SiN).

The polishing stop layer 8, the lower floating gate conductive layer, and the tunnel dielectric layer 4 are selectively patterned (etched) until surface of the substrate 2 is exposed to form at least a pair of lower floating gate lines 6 that define a gap therebetween. The lower floating gate lines 6 are parallel to Y-axis. A portion of the substrate 2 between the pair of lower floating gate lines 6 is etched to form a trench 10 therein. Thus, the formation of the lower floating gate lines 6 and the formation of the trench 10 are carried out through a single photolithographic process step.

Figure 2B:
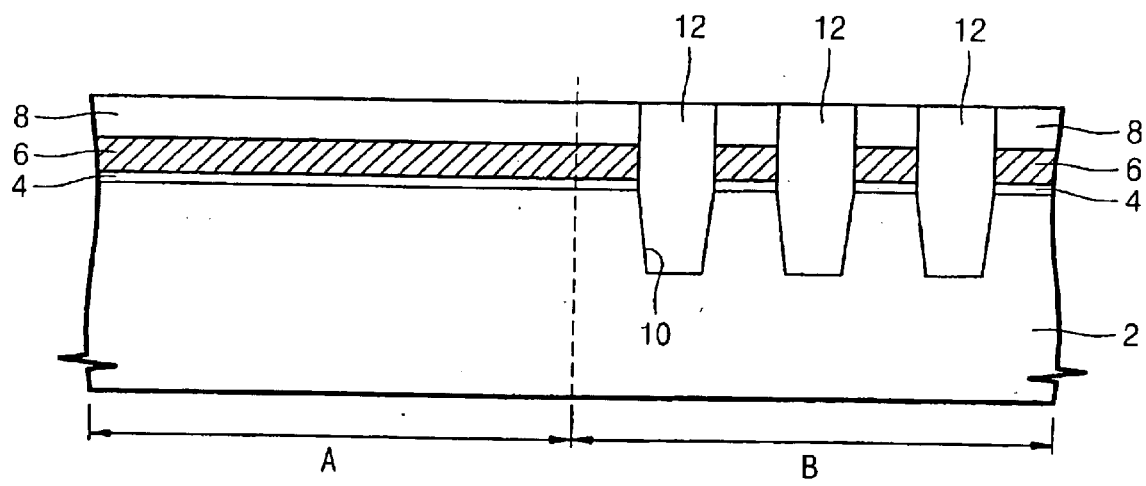

Referring to FIG. 2B, a gap-fill dielectric layer is formed to fill the trench 10, covering the top of the polishing stop pattern 8. The gap-fill dielectric layer may be formed of CVD oxide. Next, the gap-fill dielectric layer is planarized by, for example, CMP until the polishing stop pattern 8 is exposed so as to leave the gap-fill dielectric layer 12 in the trench 10 and also in the gap between the pair of lower floating gate lines 6.

Figure 2C:
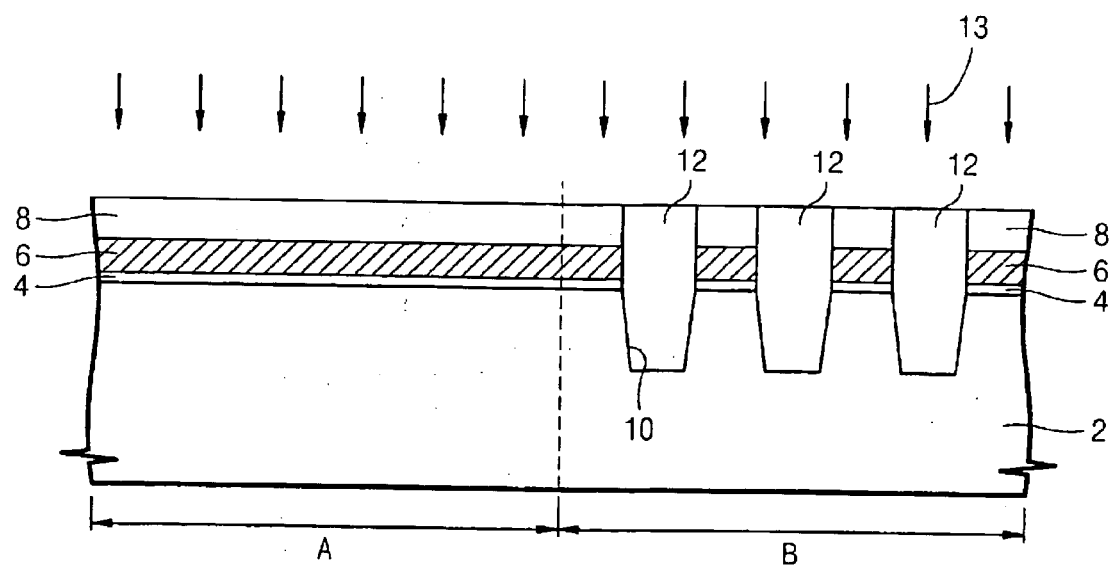

Referring to FIG. 2C, the substrate 2 including the gap-fill dielectric layer 12 is implanted with, for example, phosphorous ions. Reference numeral 13 indicates phosphorous ion implantation. The gap-fill dielectric layer 12 may contain a large quantity of positive mobile ions, which result from the CMP process and may be introduced to the lower floating gate line 6 adjacent the gap-fill dielectric layer 12.

Accordingly, the gap-fill dielectric layer 12 is implanted with phosphorous ions so as to form a getter layer that can trap positive ions, thereby improving charge retention characteristics of a non-volatile memory device. The phosphorous implantation is performed at a dose of $10 \times 10^{13}$ ions/cm2 or greater and at an energy level of about 100 KeV or less. The projection range (Rp) of implantation is preferably located in the vicinity of the lower floating gate lines 6.

Figure 2D:
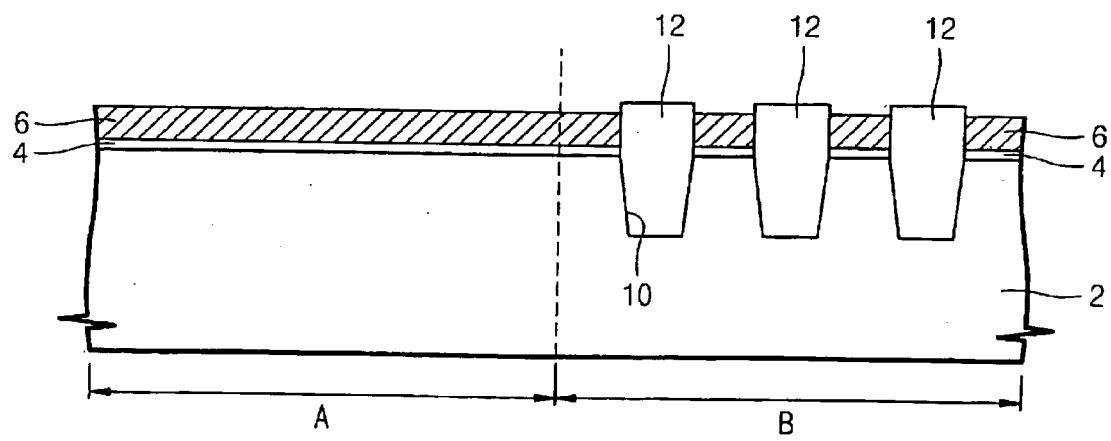

Referring to FIG. 2D, the polishing stop layer pattern 8 is removed to expose the lower floating gate lines 6.

Figure 2E:
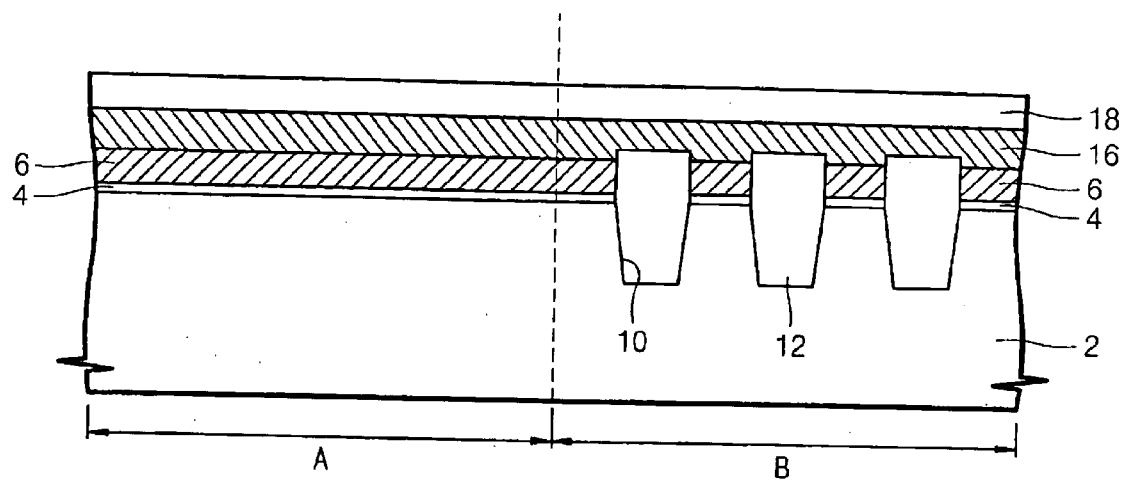

Referring to FIG. 2E, an upper floating gate conductive layer and a hard mask layer are formed successively on the lower floating gate lines 6 and on the gap-fill dielectric layer 12. The hard mask layer may be formed of a material including, but not limited to, silicon oxide, silicon nitride, silicon carbide, polysilicon, metal oxide, or metal.

Figure 2F:
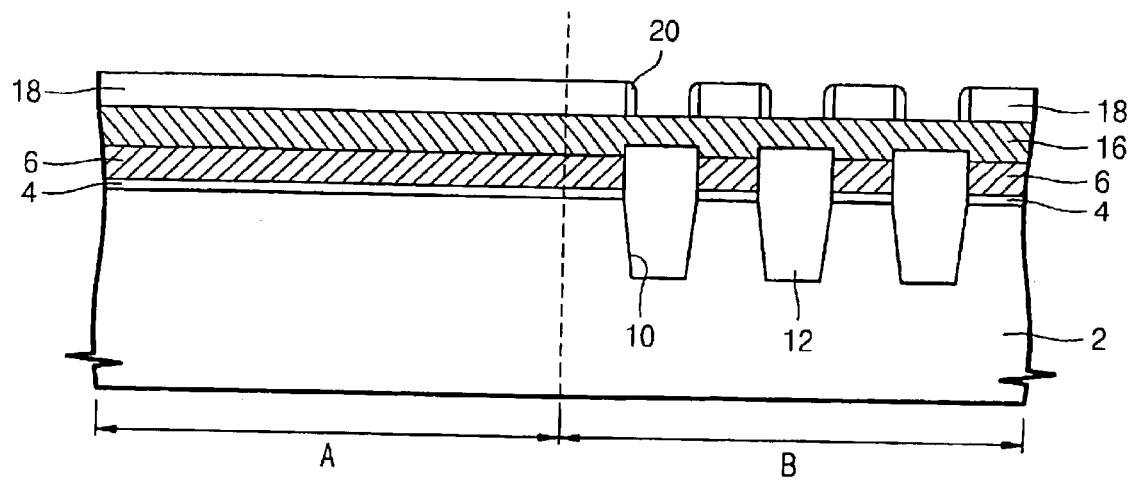

Referring to FIG. 2F, the hard mask layer is patterned by a conventional photolithographic process until the upper floating gate conductive layer formed on the gap-fill dielectric layer 12 is exposed, thereby forming a hard mask layer pattern 18.

A spacer dielectric layer may be formed on the hard mask layer pattern 18, and anisotropically etched to form spacers 20 on the sidewalls of the hard mask layer pattern 18. The spacers 20 are formed to reduce the spacing between floating gates beyond the limits of the conventional photolithographic process.

Figure 2G:
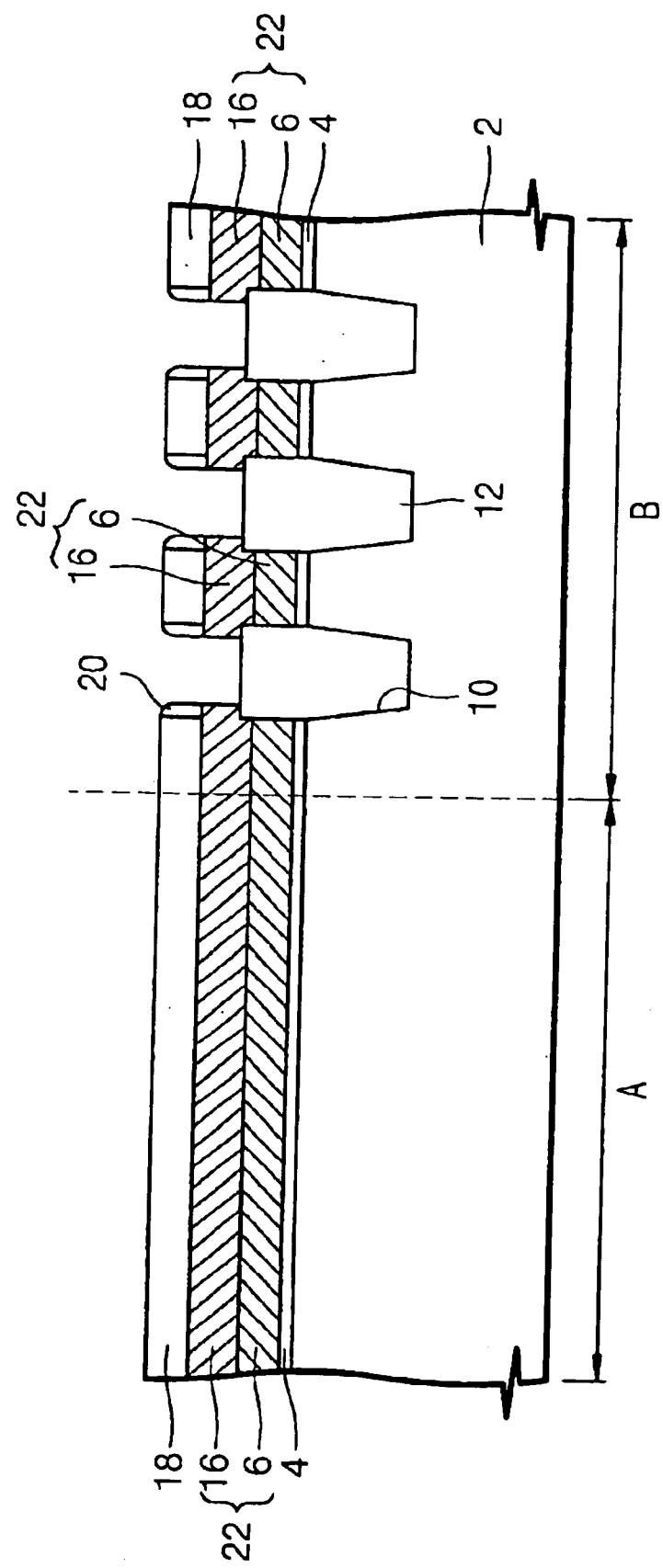
Figure 2I:
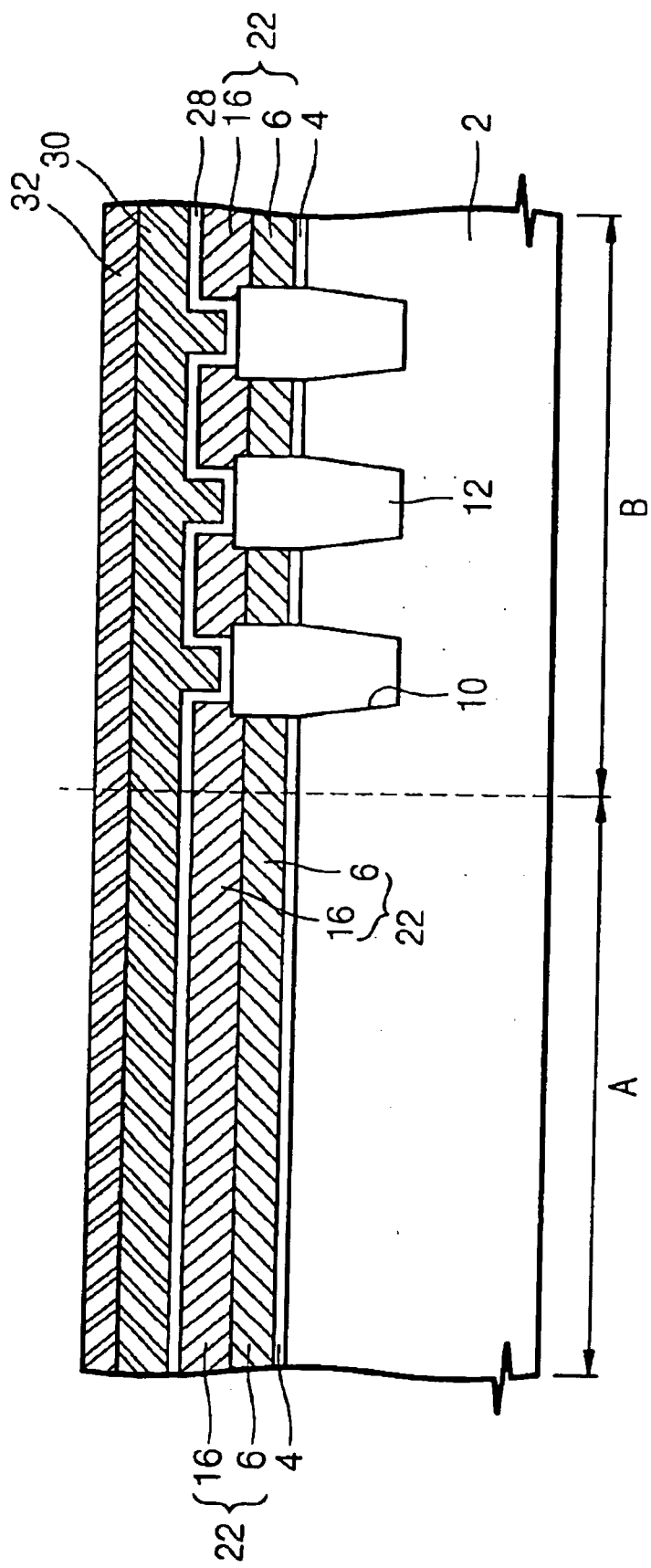

Referring to FIG. 2G, the upper floating gate conductive layer is selectively etched, using the hard mask pattern 18 and the spacers 20 as an etch mask, until the gap-fill dielectric layer 12 is exposed to form upper floating gate lines 16. The upper floating gate lines 16 are parallel to the Y-axis.

Referring to FIG. 2H, the hard mask layer pattern 18 and the spacers 20 are removed. A floating gate 22, therefore, includes the lower floating gate line 6 and the upper floating gate line 16.

Referring to FIG. 2I, an inter-gate dielectric layer 28 is formed on the floating gate 22 and on the gap-fill dielectric layer 12. The inter-gate dielectric layer 28 may be an ONO (Oxide-Nitride-Oxide) layer or other suitable materials as is known to one skilled in the art. The inter-gate dielectric layer 28 determines coupling ratio in reading/programming efficiency of the non-volatile memory device. Accordingly, if the floating gate 22 includes the lower floating gate line 6 and the upper floating gate 16, the surface area of the inter-gate dielectric layer 28 is increased and its capacitance is in turn increased.

A conductive layer is formed on the inter-gate dielectric layer 28. The conductive layer 30 may be formed of polysilicon.

Next, a silicide layer 32 may be formed on the conductive layer 30 to decrease the resistance thereof. The silicide layer 32 may be formed of a material, for example, cobalt silicide, titanium suicide, nickel silicide, tungsten silicide, platinum silicide, hafnium silicide, and palladium silicide.

Figure 2J:
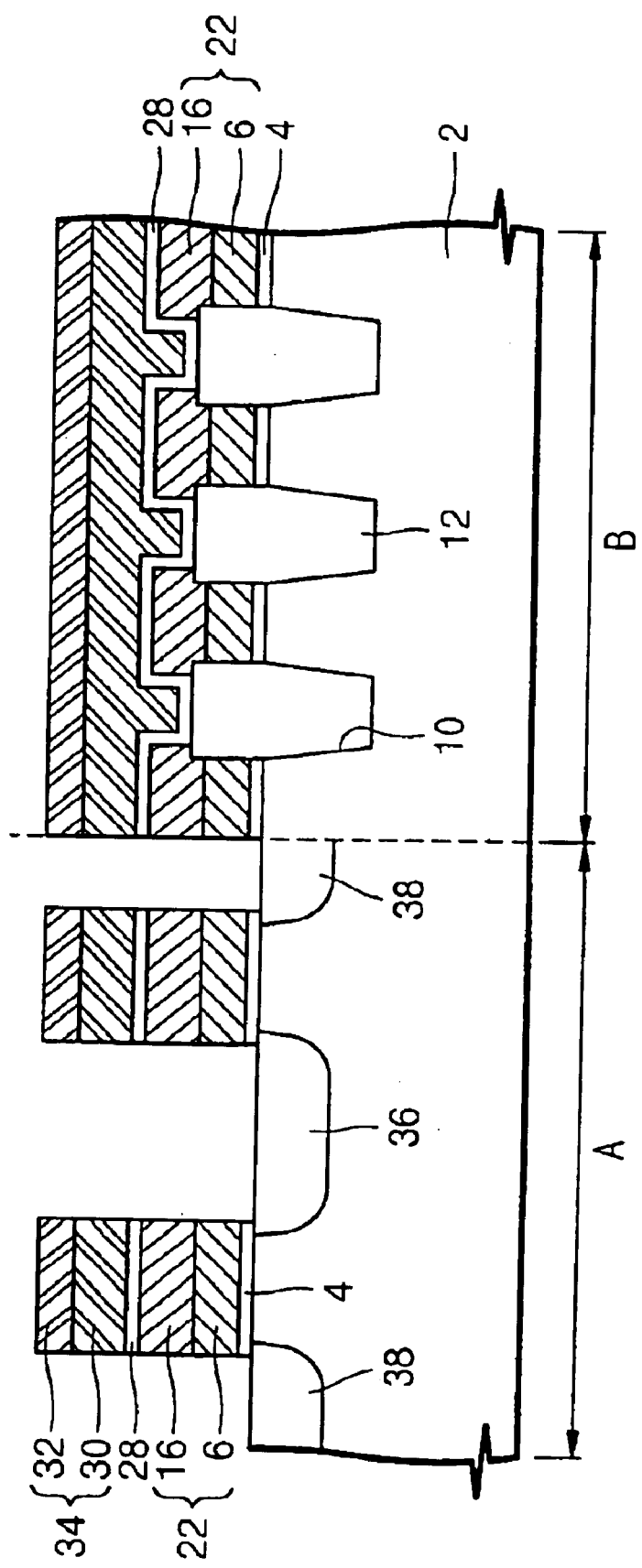

Referring to FIG. 2J, the silicide layer 32, the conductive layer 30, the inter-gate dielectric layer 28, and the floating gate 22 are patterned until surface of the substrate 2 is exposed to form a word line 34 and the floating gate 22. The word line 34 is parallel to the X-axis. The word line 34 that extends over the floating gate 22 would be a control gate 30.

Again referring to FIG. 1A, a mask layer pattern 35 is formed on the resultant structure including the substrate 2. The gap-fill dielectric layer 12 is removed using the mask layer pattern 35 and the word line 34 as an etch mask so as to connect the neighboring active regions adjacent to each other and simultaneously to form an island type field region 12.

Next, the mask layer pattern 35 is removed. A common source region 36 and a drain region 38 are formed on active regions on both sides of the word line 34 using the word line 34 and the field region 12 as an implantation mask.

An interlayer dielectric layer (not shown) is formed and a contact 40 that penetrates the drain region 38 is formed. A bit line 42 is formed and connected to the contact 40. The bit line 42 is perpendicular to the word line 34.

Figure 4:
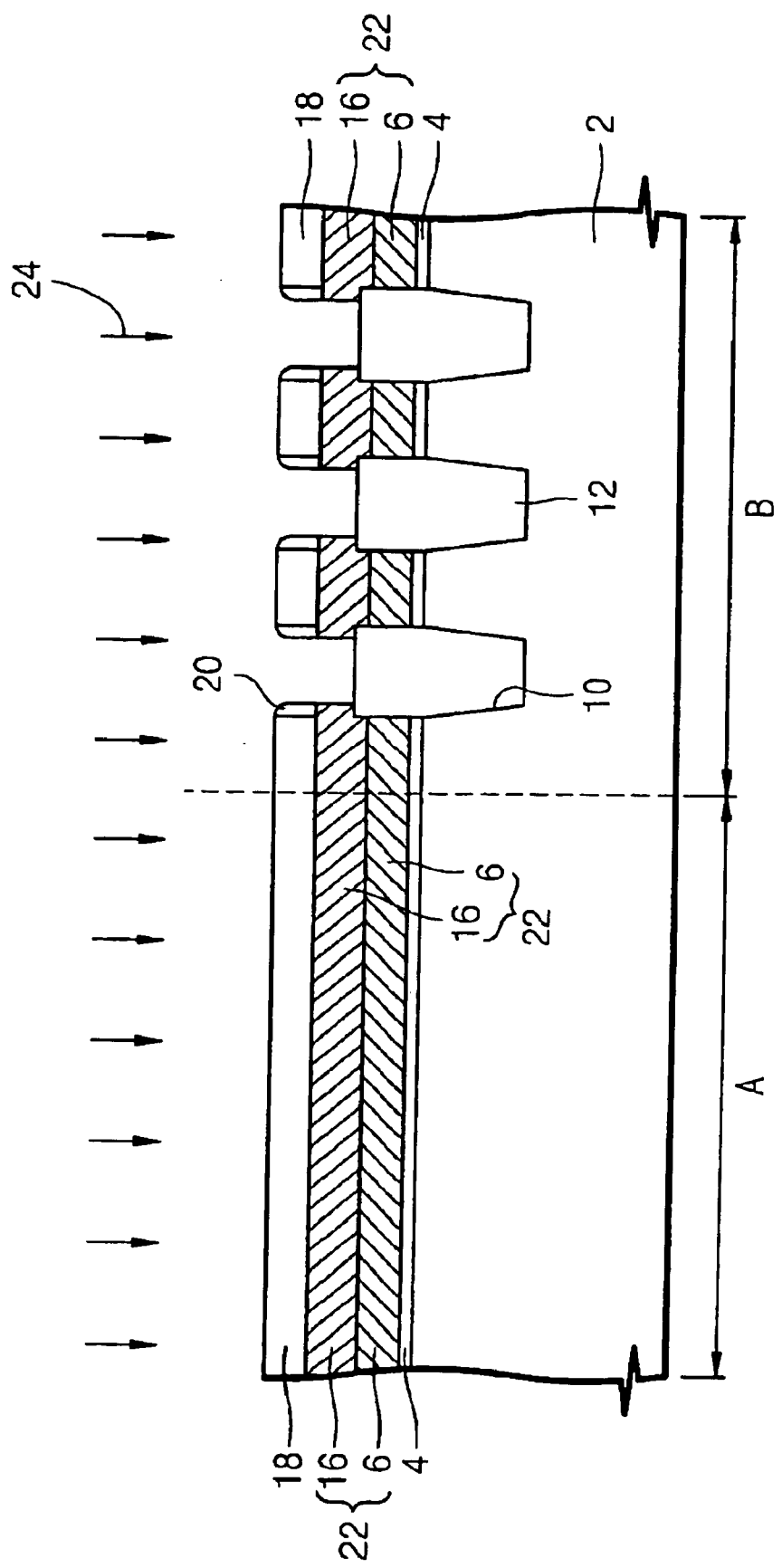
FIG. 4 is a cross-sectional view illustrating a non-volatile memory device according to yet another embodiment of the present invention.

FIGS. 3–5 are cross-sectional views illustrating other embodiments of the present invention. They are basically identical to the embodiment of the present invention described above, except for phosphorous ion implantation.

FIG. 3 is a cross-sectional view illustrating another embodiment of the present invention. In this embodiment, phosphorous ion implantation is performed after removing the polishing stop layer pattern 8 and before forming the upper floating gate conductive layer. Reference numeral 14 indicates the phosphorous ion implantation. The phosphorous ion implantation is carried out at a dose of $1.0 \times 10^{13}$ ions/cm$^2$ or greater and at an energy level of 100 KeV or less. The projection range (Rp) of implantation in the gap-fill dielectric layer 12 is located in the vicinity of the lower floating gate line 6.

FIG. 4 is a cross-sectional view illustrating yet another embodiment of the present invention. In this embodiment, phosphorous ion implantation is performed after forming the upper floating gate lines 16 and before removing the hard mask layer pattern 18. Reference numeral 24 indicates the phosphorous implantation. The phosphorous implantation is carried out at a dose of $1.0 \times 10^{13}$ ions/cm$^2$ or greater and at an energy level of 100 KeV or less. The projection range (Rp) of implantation in the gap-fill dielectric layer 12 is preferably located in the vicinity of the lower floating gate line 6.

FIG. 5 is a cross-sectional view illustrating still another embodiment of the present invention. In this embodiment, phosphorous ion implantation is performed after removing the hard mask layer pattern 18 and before forming the inter-gate dielectric layer 28.

The implantation is carried out at a dose of about $1.0 \times 10^{13}$ ions/cm$^2$ or greater and at an energy level of 100 KeV or less. The projection range (Rp) of implantation in the gap-fill dielectric layer 12 is preferably located in the vicinity of the lower floating gate line 6.

As described above, non-volatile memory devices according to embodiments of the present invention can effectively trap positive mobile ions that may penetrate into a floating gate from adjacent dielectric layers. Also, according to the present invention, a non-volatile memory device can have an excellent charge retention characteristic by forming trap positive mobile ions in the trench dielectric layer.

While this invention has been particularly shown and described with reference to preferred embodiments thereof, it will be understood by those skilled in the art that various changes in form and details may be made therein without departing from the spirit and scope of the invention as defined by the appended claims. For example, although the present invention has been described with reference to a NOR type non-volatile memory device and a method for fabricating the same, one skilled in the art will appreciate that the present invention may be applied to a NAND type non-volatile memory device and a method for fabricating the same.

What is claimed is:

1. A method for fabricating a non-volatile memory device, the method comprising:

forming at least a pair of floating gate lines on a semiconductor substrate, the pair of floating gate lines defining a gap therebetween;

etching a portion of the substrate between the pair of floating gate lines to form a trench therein;

forming a gap-fill dielectric layer in the trench and also in the gap; and implanting the gap-fill dielectric layer.

2. The method of claim 1, further comprising:

forming an inter-gate dielectric layer on the floating gate lines and on the gap-fill dielectric layer;

forming a conductive layer over the inter-gate dielectric layer; and patterning the conductive layer and the floating gate lines to form a word line and a floating gate.

3. The method as recited in claim 1, wherein implanting-comprises using phosphorous ions.

4. The method as recited in claim 3, wherein implanting is performed at a dose of about $1.0 \times 10^{13}$ ions/cm$^2$ or greater and at an energy level of about 100 KeV or less.

5. The method as recited in claim 1, wherein implanting is performed so that the projection range (Rp) of implantation is located in the vicinity of the floating gate.

6. The method as recited in claim 1, wherein the gap-fill dielectric layer is a CVD oxide.

7. The method as recited in claim 1, further comprising implanting the substrate adjacent to the word line to form source/drain regions.

8. A method for fabricating a non-volatile memory device, the method comprising:

forming at least a pair of lower floating gate lines on a substrate having a tunnel dielectric layer formed thereon, the pair of lower floating gate lines defining a gap therebetween;

forming a polishing stop layer pattern on the lower floating gate lines;

etching a portion of the substrate between the pair of lower floating gate lines to form a trench therein;

forming a gap-fill dielectric layer in the trench and also in the gap;

removing the polishing stop layer pattern to expose surface of the pair of lower floating gate lines;

forming a upper floating gate conductive layer on the exposed lower floating gate lines and on the gap-fill dielectric layer;

forming a hard mask layer pattern on the upper floating gate conductive layer;

etching a portion of the upper floating gate conductive layer, until the gap-fill dielectric layer is exposed, to form upper floating gate lines on the lower floating gate lines, using the hard mask layer pattern as an etch mask;

removing the hard mask layer pattern;

forming an inter-gate dielectric layer on the upper floating gate lines and on the gap-fill dielectric layer;

forming a conductive layer on the inter-gate dielectric layer;

patterning the conductive layer, the upper floating gate lines, and the lower floating gate lines to form a word line and a floating gate; and implanting the gap-fill dielectric layer with impurities.

9. The method as recited in claim 8, wherein implanting is performed by using phosphorous ions.

10. The method as recited in claim 8, wherein implanting is performed at a dose of about $1.0 \times 10^{13}$ ions/cm$^2$ or greater and at an energy level of about 100 KeV or less.

11. The method as recited in claim 8, wherein implanting is performed so that the projection range (Rp) of implantation is located in the vicinity of the floating gate.

12. The method as recited in claim 8, wherein implanting is performed after forming a gap-fill dielectric layer in the trench and the gap between the lower floating gate lines and before removing the polishing stop layer pattern.

13. The method as recited in claim 8, wherein implanting is performed after removing the polishing stop layer pattern and before forming the upper floating gate conductive layer.

14. The method as recited in claim 8, wherein implanting is performed after etching the upper floating gate conductive layer using the hard mask layer pattern and before removing the hard mask layer pattern.

15. The method as recited in claim 8, wherein implanting is performed after removing the hard mask layer pattern and before forming the inter-gate dielectric layer.

16. The method as recited in claim 8, further comprising forming spacers on sidewalls of the hard mask layer pattern.

17. The method as recited in claim 8, wherein the upper floating gate lines overlap a portion of the gap-fill dielectric layer.

18. The method as recited in claim 8, wherein the gap-fill dielectric layer is a CVD oxide.

19. The method as recited in claim 8, further comprising implanting the substrate adjacent to the word line to form source/drain regions.

* * * * *

UNITED STATES PATENT AND TRADEMARK OFFICE
CERTIFICATE OF CORRECTION

PATENT NO. : 6,818,511 B2
DATED : November 16, 2004
INVENTOR(S) : Lee

It is certified that error appears in the above-identified patent and that said Letters Patent is hereby corrected as shown below:

Column 4,
Line 53, replace "titanium suicide, nickel" with -- titanium silicide, nickel --.

Column 6,
Lines 16 and 17, please replace "wherein implanting-comprises" with
-- wherein implanting comprises --.

Signed and Sealed this

Twenty-seventh Day of December, 2005

JON W. DUDAS
*Director of the United States Patent and Trademark Office*